(12) United States Patent
Andry et al.

(10) Patent No.: US 9,200,883 B2
(45) Date of Patent: Dec. 1, 2015

(54) TRANSFERABLE PROBE TIPS

(75) Inventors: Paul S. Andry, Yorktown Heights, NY (US); Bing Dang, Chappaqua, NY (US); Steven L. Wright, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 819 days.

(21) Appl. No.: 13/101,253

(22) Filed: May 5, 2011

(65) Prior Publication Data

US 2012/0279287 A1 Nov. 8, 2012

(51) Int. Cl.

| | | |
|---|---|---|
| G01N 27/84 | (2006.01) | |
| G01R 33/12 | (2006.01) | |
| G01R 31/26 | (2014.01) | |
| H01L 21/66 | (2006.01) | |
| H01L 21/44 | (2006.01) | |
| G01B 5/28 | (2006.01) | |
| G03F 7/00 | (2006.01) | |
| G01R 1/073 | (2006.01) | |
| G01R 3/00 | (2006.01) | |
| G01Q 70/14 | (2010.01) | |
| G01R 1/067 | (2006.01) | |
| G01Q 70/16 | (2010.01) | |
| G01Q 40/02 | (2010.01) | |

(52) U.S. Cl.
CPC .............. G01B 5/28 (2013.01); G01R 1/07378 (2013.01); G01R 3/00 (2013.01); G03F 7/00 (2013.01); *G01Q 40/02* (2013.01); *G01Q 70/14* (2013.01); *G01Q 70/16* (2013.01); *G01R 1/067* (2013.01); *G01R 1/06738* (2013.01)

(58) Field of Classification Search
CPC ...... G01R 3/00; G01R 1/067; G01R 1/06738; G01Q 40/02; G01Q 70/14; G01Q 70/16
See application file for complete search history.

(56) References Cited

U.S. PATENT DOCUMENTS

| | | | |
|---|---|---|---|
| 6,520,778 B1* | 2/2003 | Eldridge et al. | 439/66 |
| 6,690,185 B1* | 2/2004 | Khandros et al. | 324/756.03 |
| 6,690,186 B2* | 2/2004 | Fjelstad | 324/756.03 |
| 7,363,705 B2* | 4/2008 | Kim et al. | 29/842 |
| 2002/0053734 A1* | 5/2002 | Eldridge et al. | 257/724 |
| 2002/0152804 A1* | 10/2002 | Shiotani et al. | 73/105 |
| 2005/0191913 A1* | 9/2005 | Farnworth et al. | 439/862 |
| 2005/0253606 A1* | 11/2005 | Kim et al. | 324/754 |
| 2005/0255707 A1* | 11/2005 | Hart et al. | 438/758 |
| 2006/0019027 A1* | 1/2006 | Eldridge et al. | 427/96.8 |
| 2006/0109015 A1* | 5/2006 | Thacker et al. | 324/754 |

(Continued)

*Primary Examiner* — Patrick Assouad
*Assistant Examiner* — Hoang X Nguyen
(74) *Attorney, Agent, or Firm* — Ryan, Mason & Lewis, LLP

(57) ABSTRACT

Transferable probe tips including a metallic probe, a delamination layer covering a portion of the metallic probe, and a bonding alloy, wherein the bonding alloy contacts the metallic probe at a portion of the probe that is not covered by the delamination layer are provided herein. Also, techniques for creating a transferable probe tip are provided, including etching a handler substrate to form one or more via arrays, depositing a delamination layer in each via array, depositing one or more metals in each via array to form a probe tip structure, and depositing a bonding alloy on a portion of the probe tip structure that is not covered by the delamination layer. Additionally, techniques for transferring transferable probe tips are provided, including removing a handler substrate from a probe tip structure, and transferring the probe tip structure via flip-chip joining the probe tip structure to a target probe head substrate.

22 Claims, 5 Drawing Sheets

(56) References Cited

U.S. PATENT DOCUMENTS

2006/0186874 A1* 8/2006 Mackin et al. ............. 324/158.1
2007/0269997 A1* 11/2007 Eldridge et al. ................ 439/66
2007/0279043 A1* 12/2007 Takahashi ..................... 324/149
2008/0179755 A1* 7/2008 Andry et al. .................. 257/774
2010/0326702 A1* 12/2010 Dang et al. .................... 174/250
2012/0219793 A1* 8/2012 Fritz et al. ..................... 428/339
2012/0249173 A1* 10/2012 Hamel et al. ............. 324/755.01
2012/0279287 A1* 11/2012 Andry et al. .................... 73/105
2012/0326247 A1* 12/2012 Dang et al. .................... 257/414
2013/0015440 A1* 1/2013 Dang et al. ...................... 257/48
2014/0015623 A1* 1/2014 Sherrer ........................... 333/34

\* cited by examiner

TRANSFERABLE PROBE TIPS

FIELD OF THE INVENTION

The present invention generally relates to probe-based technologies, and, more particularly, to probe tips.

BACKGROUND OF THE INVENTION

The scaling of wafer probes to finer pitch presents challenges, as the cost and complexity of wafer probe technology increases. By way of example, in existing approaches, challenges in probe tips include scalability, material selection flexibility, and cost of fabrication. Conventional probe card and probe tip technologies have been extended to cover area array interconnection pitches down to the range 150-200 microns. However, there is demand for probing solutions for area array pitches 50 microns and smaller, solutions which are difficult to achieve with existing approaches. Furthermore, there is a need for fine-pitch probing solutions for three-dimensional silicon device structures.

SUMMARY OF THE INVENTION

Principles of the present invention provide transferable probe tips. In one example embodiment of the invention, transferable probe tips including a metallic probe, a delamination layer, wherein the delamination layer covers a portion of the metallic probe, and a bonding alloy, wherein the bonding alloy contacts the metallic probe at a portion of the probe that is not covered by the delamination layer are provided.

In an exemplary method for creating a transferable probe tip, according to one aspect of the invention, can include steps of etching a handler substrate to form one or more via arrays, depositing a delamination layer in each via array, depositing one or more metals in each via array to form a probe tip structure, and depositing a bonding alloy on a portion of the probe tip structure that is not covered by the delamination layer.

Also, in an exemplary method for transferring one or more transferable probe tips, according to one aspect of the invention, can include steps of removing a handler substrate from a probe tip structure, and transferring the probe tip structure via flip-chip joining the probe tip structure to a target probe head substrate.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

Principles of the present invention include techniques for the fabrication and transfer of fine-pitch probe tips. As detailed herein, fine-pitch probe arrays can be pre-fabricated in a temporary handler substrate. The handler substrate can then be flip-chip joined to a target probe head substrate (such as, for example, a probe card or test interposer) to transfer the probe arrays.

As described herein, one or more embodiments of the invention can include one of two ways to remove a structure on top of a delamination layer (that is, a low-adhesion or sacrificial layer): 1) rely on a very low-adhesion layer, which allows the structure to be pealed off (essentially a mechanical delamination process), or 2) provide a layer (for example, a sacrificial layer) that either thermally decomposes or can be chemically dissolved, which also allows delamination.

As used herein, a handler substrate refers to a silicon substrate used to fabricate and handle transferable probe tips, and a probe head substrate refers to a target substrate that goes into the probe head. In one or more embodiments of the invention, the probe head substrate includes a silicon substrate containing through-silicon vias (TSVs), wiring redistribution layers or that structure with additional active devices.

Utilizing semiconductor photolithographic and wafer bonding processes, a temporary handler substrate can be etched to form via arrays. The via arrays are filled with metal as a probe structure. Also, when a sacrificial layer is integrated or the surface adhesion is tuned, the probes can be removed from the handler substrates.

Additionally, in one or more embodiments of the invention, with solder pads on the bottom of the probes, the probe arrays can be joined to any substrate with receiving pads, using a traditional flip-chip assembly method. After the handler substrate is removed, the probes are transferred to the new substrate (as noted, for example, a probe card, test interposer, etc.).

As described herein, one or more embodiments of the invention include high-density transferable probe tips. Such probe tips can include a low cost associated with simple silicon (Si) processing, and flexibility in the use of any shape and/or dimension, as well as a wide range of metals. The transferable probe tips can also include flip-chip assembly and release, as well as be implemented in a wide range of applications such as, for example, conventional probe cards, a thin film interposer probe, a neuron probe array in bioengineering, etc.

Figure 1:
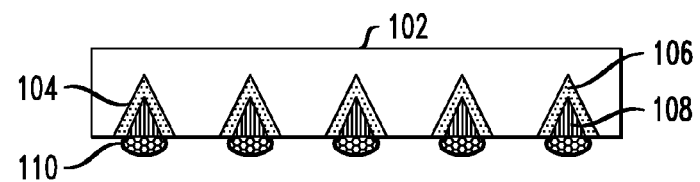
FIG. 1 is a diagram illustrating an example probe tip array based on silicon (Si) processing, according to an embodiment of the present invention.

FIG. 1 is a diagram illustrating an example probe tip array based on silicon (Si) processing, according to an embodiment of the present invention. By way of illustration, FIG. 1 depicts a silicon (Si) substrate 102, cavities (such as the one depicted by item 104) etched in the Si substrate, a delamination layer (for example, a low-adhesion or sacrificial layer) layer 106, metallic probes (such as the one depicted by item 108), and bonding alloys (such as the one depicted by item 110). A delamination layer can allow structural elements to be separated from each other, either by providing a layer which can be chemically dissolved or etched, or by providing a layer which is mechanically stressed and inherently low-adhesion.

Figure 2:
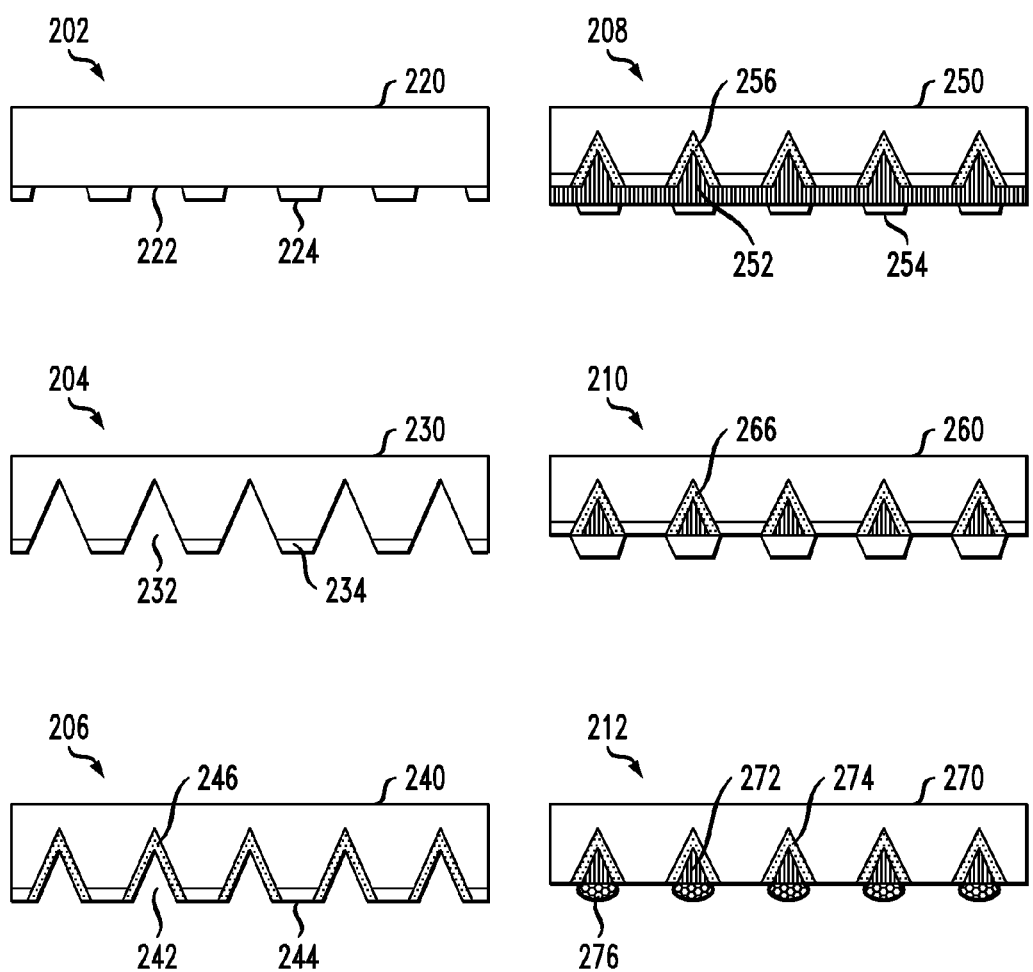
FIG. 2 is a diagram illustrating an example Si processing fabrication sequence, according to an embodiment of the present invention.

FIG. 2 is a diagram illustrating an example Si processing fabrication sequence, according to an embodiment of the present invention, in the image order 202, 204, 206, 208, 210, and 212. Sequence image 202 depicts a patterned Si wafer with a hard mask, such as silicon dioxide. Specifically, image 202 includes Si substrate 220 and hard masking layer 224, with openings 222. Sequence image 204 depicts a subsequent process step utilizing an anisotropic Si etch (for example, tetramethylammonium hydroxide (TMAH)). Silicon anisotropic etchants have etch rates along (111) directions of the crystal lattice which are much slower than other directions. Specifically, image 204 includes Si substrate 230, anisotropic etch pit 232 (bounded by silicon 111 planes), and hard mask layer 234 (such as silicon dioxide).

Sequence image 206 depicts formation of a release layer. Specifically, image 206 includes Si substrate 240, anisotropic etch pit 242 with delamination layer (for example, a low-adhesion release layer) 246, and hard mask layer 244. Sequence image 208 depicts the deposit of a metal or series of metals. Specifically, image 208 includes Si substrate 250, metallic probes (such as the one depicted by item 252), delamination layer 256, and additional masking layer 254.

Sequence image 210 depicts isolating inverted tips, for example, by Chemical-Mechanical Polishing (CMP). Specifically, image 210 includes a Si substrate 260, metallic probes (such as the one depicted by item 262), a delamination layer 266, and additional masking layer 264. Further, sequence image 212 depicts removal of the additional masking layer, and depositing joining metallurgy. Specifically, image 212 includes a Si substrate 270, metallic probes (such as the one depicted by item 272), a delamination layer 274 and bonding alloys (such as the one depicted by item 276).

Figure 3:
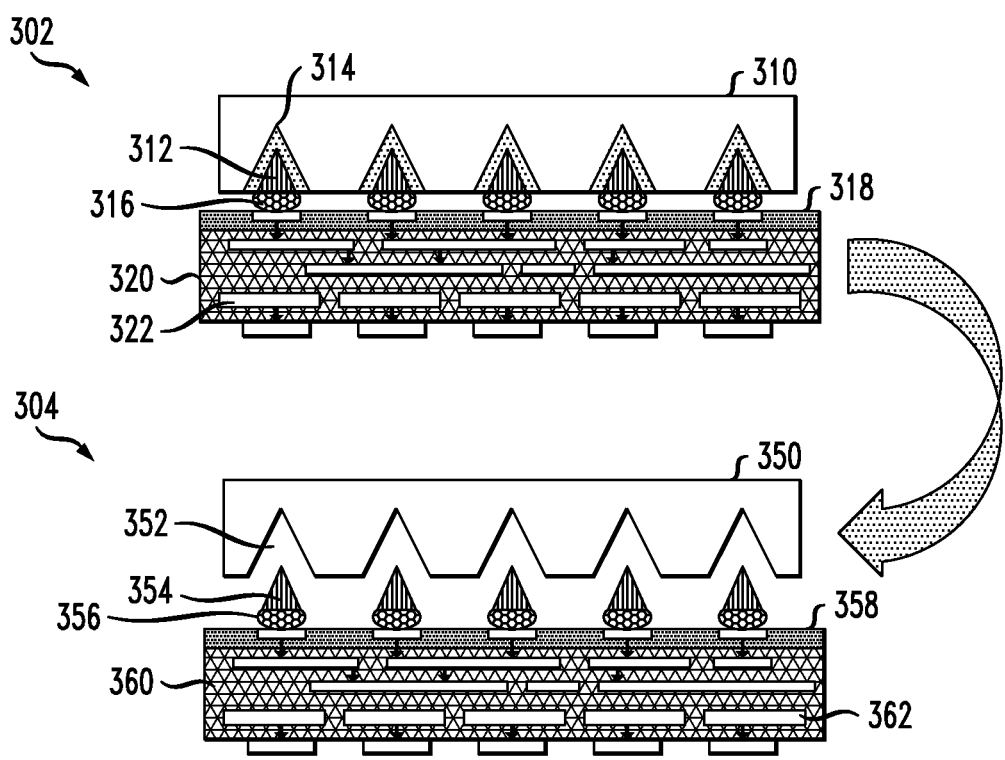
FIG. 3 is a diagram illustrating an example probe tip array transfer process, according to an embodiment of the present invention.

FIG. 3 is a diagram illustrating an example probe tip array transfer process, according to an embodiment of the present invention. By way of illustration, FIG. 3 depicts process image 302 and process image 304. Image 302 includes Si substrate 310, metallic probes (such as the one depicted by item 312), a delamination layer 314, bonding alloy bumps (such as the one depicted by item 316), dielectric layer 318, and probe head chip 320. In one or more embodiments of the invention, the probe head chip 320 is made out of Si, and contains through-silicon vias (TSVs) and wiring redistribution layers 322. If the probe head chip 320 is made out of Si, it may or may not contain active circuitry for test, such as CMOS FETs (Complementary Metal Oxide Field Effect Transistors), not depicted in FIG. 3. Process image 302 depicts the structure after melting the bonding alloy bumps and joining to the silicon probe head chip 320. Process image 304 depicts the structure during release of the delamination layer (for example, a low-adhesion or sacrificial layer).

Additionally, image 304 includes Si handler substrate 350, anistropic etch pits 352, metallic probes (such as the one depicted by item 354), bonding alloys (such as the one depicted by item 356), hard dielectric layer 358, probe head chip 360 and wiring redistribution layers 362.

As depicted by FIG. 3, in one or more embodiments of the invention, probe tip chips can be assembled with a flip-chip process. Also, the handler chip can be removed and the probe tips can be transferred to a test card.

Figure 4:
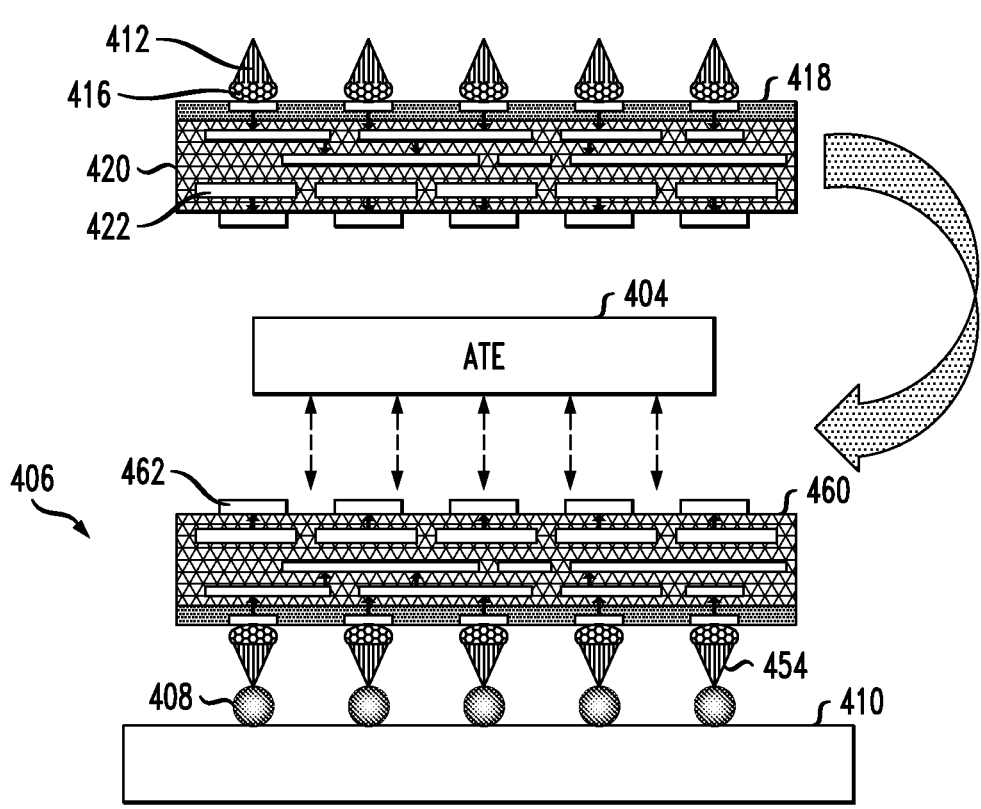
FIG. 4 is a diagram illustrating an example probe tip array final assembly process and positioning for wafer-level probing, according to an embodiment of the present invention.

FIG. 4 is a diagram illustrating an example probe tip array final assembly process and positioning for wafer-level probing, according to an embodiment of the present invention. By way of illustration, FIG. 4 depicts process image 402 of completed probe head assembly 420, automated test equipment (ATE) 404, containing the probe card and associated electronic test equipment. Assembly process and structure image 406 depicts a probe head assembled to a probe card, and a semiconductor wafer 410 to be tested, containing solder bumps 408 to be probed.

Image 402 includes metallic probes (such as the one depicted by item 412), bonding alloys (such as the one depicted by item 416), hard dielectric layer 418, probe head 420 and wiring redistribution layers 422. Additionally, image 406 includes the probe head 460 assembled to the probe card 404. In one or more embodiments of the invention, the probe head 460 is connected to the probe card 404 through spring-loaded pins, and the elements 462 include metallic pads. In one or more additional embodiments of the invention, the elements 462 are solder bumps and the probe head 460 is joined to the probe card 404 using a flip-chip bonding process. The probe head 460 can also contain metallic probes (such as the one depicted by item 454), for touchdown and electrical connection to bumps 460 on the surface of the wafer under test 410.

Figure 5:
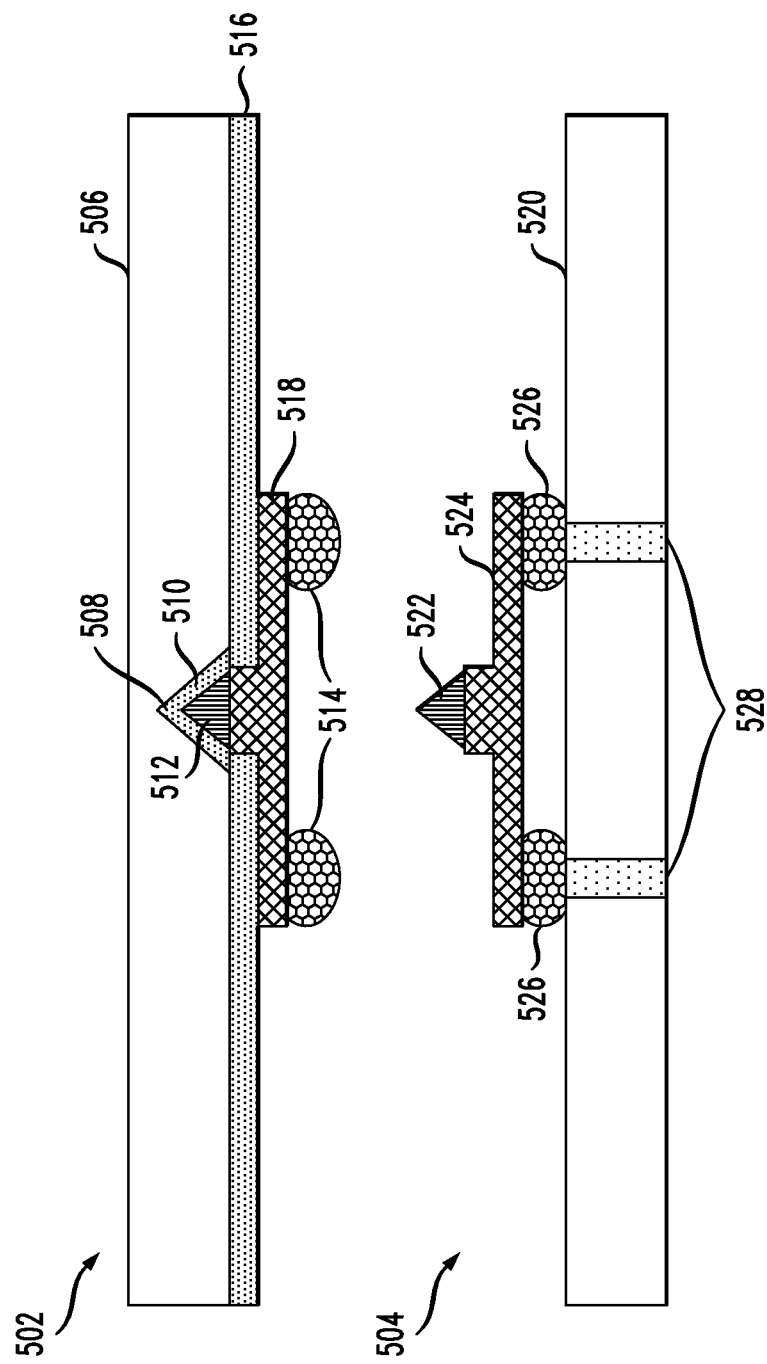
FIG. 5 is a diagram illustrating an example of a probe tip array with built-in compliance, according to an embodiment of the present invention.

FIG. 5 is a diagram illustrating an example of a probe tip array with built-in compliance, according to an embodiment of the present invention. In this regard, the term compliance refers to the ability of individual probe tips to move a short distance during touchdown and contact to the bumps on the surface of the test wafer, and to also return to their original position upon removal of touchdown. By way of illustration, FIG. 5 depicts example image 502 and example image 504. Image 502 includes Si handler substrate 506, a cavity 508, a delamination layer 510, a metallic probe 512, bonding alloys 514, additional delamination layer 516 and flexible support membrane 518. Additionally, image 504 includes Si probe head chip 520, metallic probe 522, flexible support membrane 524, bonding alloys 526, and through-Si vias (TSVs) 528.

In one or more embodiments of the invention, two or more supporting bonding alloy support elements are utilized with each probe tip. In one or more additional embodiments of the invention, only a single bonding alloy support element 526 is utilized. Depending upon the dimension and composition of support membrane 518 and bonding alloy bump 526, compliance up to several microns can be achieved.

As detailed herein, one or more embodiments of the invention include transferable probe tips. Accordingly, a (high-density) transferable probe tip includes a metallic probe, a delamination layer, wherein the delamination layer can be a low-adhesion or sacrificial layer that covers a portion of the metallic probe, and a bonding alloy, wherein the bonding alloy contacts the metallic probe at a portion of the probe that is not covered by the delamination layer. In one or more embodiments of the invention, the transferable probe tip can also include a solder pad (for example, a solder pad implemented on a bottom portion of the probe).

In one or more embodiments of the invention, the tip can be attached to a separately-fabricated silicon probe head substrate containing through-silicon vias and one or more wiring redistribution layers. Additionally, the tip can also be attached to a separately-fabricated silicon probe head substrate containing through-silicon vias, one or more wiring redistribution layers and one or more field-effect transistor devices.

In one or more embodiments of the invention, a metallic probe can include at least one of nickel (Ni), copper (Cu), tungsten (W), cobalt (Co), titanium (Ti), iron (Fe), tantalum (Ta), tantalum nitride (TaN), platinum (Pt), palladium (Pd), gold (Au), molybdenum (Mo), rhenium (Re), beryllium (Be), and silver (Ag). Also, a delamination layer can include at least one of low-temperature silicon dioxide ($SiO_2$), sputtered copper (Cu), sputtered gold (Au), sputtered aluminum (Al), and spin-on polycarbonate. Further, a bonding alloy can include at least one of tin (Sn), gold-tin (AuSn), tin-silver (SnAg), tin-silver-copper (SnAgCu), indium (In), and tin-lead (SnPb).

According to one or more embodiments of the invention, the transferable probe tip process is particularly amenable to creation of 3D Si probe heads (a structure which is attractive, for example, for fine pitch).

Figure 6:
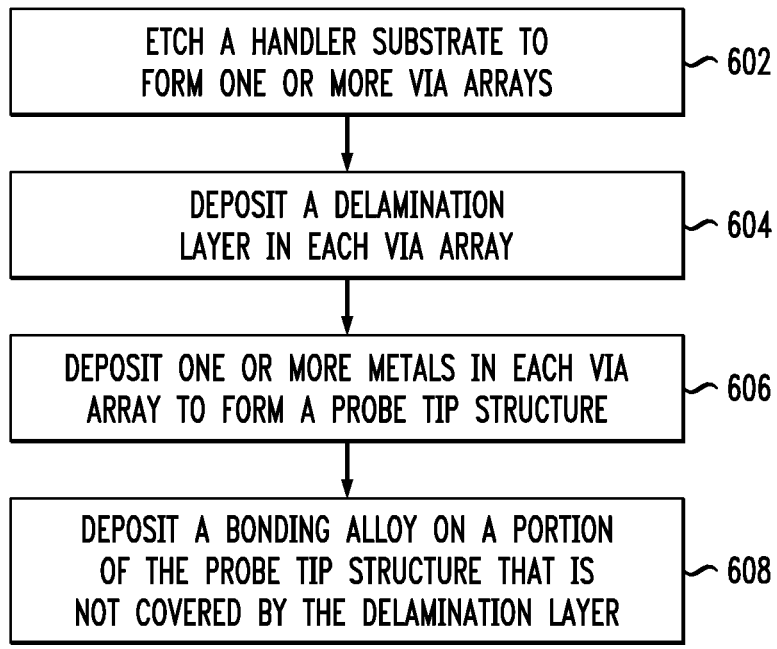
FIG. 6 is a flow diagram illustrating techniques for creating a transferable probe tip, according to an embodiment of the present invention.

FIG. 6 is a flow diagram illustrating techniques for creating a transferable probe tip, according to an embodiment of the present invention. Step 602 includes etching a handler substrate to form one or more via arrays. The handler substrate can include, for example, a Si substrate, and can also be a temporary handler substrate. Etching a handler substrate to form one or more via arrays can include anisotropic etching (for example, using tetramethylammonium hydroxide (TMAH)).

Step 604 includes depositing a delamination layer in each via array. Step 606 includes depositing one or more metals in each via array to form a probe tip structure. Step 608 includes depositing a bonding alloy on a portion of the probe tip structure that is not covered by the delamination layer. A delamination layer can allow structural elements to be separated from each other, either providing a layer which can be chemically dissolved or etched, or by providing a layer which is mechanically stressed and inherently low-adhesion.

The techniques depicted in FIG. 6 can also include forming a pattern on the handler substrate with a hard mask, as well as isolating each inverted probe tip (for example, by CMP). One or more embodiments of the invention additionally include implementing one or more solder pads on a bottom portion of each transferable probe tip, for example, so that the probe arrays can be joined to any substrates with receiving pads in the traditional flip-chip assembly method.

Figure 7:
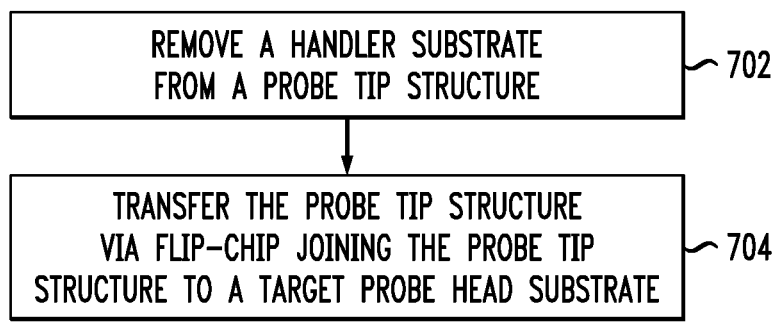
FIG. 7 is a flow diagram illustrating techniques for transferring one or more transferable probe tips, according to an embodiment of the present invention.

FIG. 7 is a flow diagram illustrating techniques for transferring one or more transferable probe tips (for example, transferable probe tips created according to the techniques detailed herein, according to an embodiment of the present invention. Step 702 includes removing a handler substrate from a probe tip structure. Removing a handler substrate from a probe tip structure can also include, for example, integrating a sacrificial layer to the probe tip structure, as well as tuning surface adhesion of the probe tip structure. Step 704 includes transferring the probe tip structure via flip-chip joining the probe tip structure to a target probe head substrate (such as, for example, a probe card or test interposer).

The techniques depicted in FIG. 7 can also include transferring the probe tip structure to a Si probe head chip containing one or more through-silicon vias (TSVs). Additionally, in one or more embodiments of the invention, such a Si probe head chip can include one or more through-silicon vias (TSVs) and one or more active circuits.

The probe head substrate may include a ceramic or organic laminate structure containing redistribution wiring layers. In one or more embodiments of the invention, the probe head substrate contains a silicon (Si) die containing through-silicon-vias (TSVs) and wiring redistribution layers. Also, in one or more embodiments of the invention, the Si probe head die contains active field-effect transistor circuits such as those in a particular layer of a three-dimensional (3D) Si structure, also containing TSVs. Such 3D Si layers are generally no thicker than 50 to 100 microns, and fabrication requires a wafer thinning process with a handler wafer. As such, there are limitations on the kinds of final processing steps which can be employed after the active device and wiring levels have been fabricated.

In one example, there is a limitation on the maximum temperature of final processes which can be employed. One or more embodiments of the invention provide a method of probe tip fabrication that can utilize high-temperature processing steps performed on a separate handler substrate, followed by transfer of the probe tip structure to the 3D Si device structure contained in the probe head substrate. In this way, the techniques provide a method of probe tip fabrication which is amenable to creation of probe heads containing 3D active circuits.

At least one embodiment of the invention may provide one or more beneficial effects, such as, for example, encompassing a low cost associated with simple Si processing, and providing flexibility in the use of any shape and/or dimension (for example, pyramid, cone, etc.), as well as a wide range of metals.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A transferable probe tip, wherein the transferable probe tip comprises:
    a metallic non-compliant probe, wherein the metallic probe is non-compliant from a bottom portion of the metallic probe through an upper portion of the metallic probe that is affixed to a non-compliant tip;
    a delamination layer, wherein the delamination layer covers a portion of the metallic probe, and wherein the delamination layer comprises $SiO_2$; and
    a bonding alloy, wherein the bonding alloy contacts the metallic probe at a portion of the probe that is not covered by the delamination layer.

2. The transferable probe tip of claim 1, wherein the delamination layer comprises a low-adhesion layer.

3. The transferable probe tip of claim 1, wherein the delamination layer comprises a sacrificial layer.

4. The transferable probe tip of claim 1, wherein the metallic non-compliant probe comprises at least one of Ni, Cu, W, Co, Ti, Fe, Ta, TaN, Pt, Pd, Au, Mo, Re, Be, and Ag.

5. The transferable probe tip of claim 1, wherein the bonding alloy comprises at least one of Sn, AuSn, SnAg, SnAgCu, In, and SnPb.

6. The transferable probe tip of claim 1, further comprising a solder pad.

7. The transferable probe tip of claim 6, wherein the solder pad is implemented on a bottom portion of the probe.

8. The transferable probe tip of claim 1, wherein the transferable probe tip is attached to a separately-fabricated silicon probe head substrate containing through-silicon vias and one or more wiring redistribution layers.

9. The transferable probe tip of claim 1, wherein the transferable probe tip is attached to a separately-fabricated silicon probe head substrate containing through-silicon vias, one or more wiring redistribution layers and one or more field-effect transistor devices.

10. A method for creating a transferable probe tip, comprising the steps of:
    etching a handler substrate to form one or more via arrays;
    depositing a delamination layer in each via array, wherein the delamination layer comprises $SiO_2$;
    depositing one or more metals in each via array to form a non-compliant probe structure, wherein the probe structure is non-compliant from a bottom portion of the probe structure through an upper portion of the probe structure that is affixed to a non-compliant tip of the probe structure; and depositing a bonding alloy on a portion of the non-compliant probe tip structure that is not covered by the delamination layer.

11. The method of claim 10, wherein the delamination layer comprises a low-adhesion layer.

12. The method of claim 10, wherein the delamination layer comprises a sacrificial layer.

13. The method of claim 10, wherein the handler substrate comprises a silicon (Si) substrate.

14. The method of claim 10, wherein the handler substrate comprises a temporary handler substrate.

15. The method of claim 10, further comprising forming a pattern on the handler substrate with a hard mask.

16. The method of claim 10, further comprising isolating each of one or more inverted probe tips.

17. The method of claim 10, wherein etching a handler substrate to form one or more via arrays comprises anisotropic etching.

18. The method of claim 17, wherein anisotropic etching comprises using tetramethylammonium hydroxide (TMAH).

19. The method of claim 10, further comprising implementing one or more solder pads on a bottom portion of each transferable probe tip.

20. The method of claim 10, comprising:

removing the handler substrate from the non-compliant probe structure;

integrating the delamination layer to the non-compliant probe structure; and transferring the non-compliant probe structure via flip-chip joining the non-compliant probe tip structure to a target probe head substrate.

21. The method of claim 20, further comprising transferring the non-compliant probe structure to a Si probe head chip containing one or more through-silicon vias (TSVs).

22. The method of claim 21, wherein the Si probe head chip contains one or more through-silicon vias (TSVs) and one or more active circuits.

* * * * *